US012763292B2

(12) United States Patent
Han et al.

(10) Patent No.: US 12,763,292 B2
(45) Date of Patent: Oct. 13, 2026

(54) UPPER ELECTRODE ASSEMBLY

(71) Applicant: HANA MATERIALS INC., Cheonan-si (KR)

(72) Inventors: Tae Gun Han, Cheonan-si (KR); Je Hee Lee, Anseong-si (KR); Eun Young Lee, Cheonan-si (KR)

(73) Assignee: HANA MATERIALS INC., Cheonan-si (KR)

( * ) Notice: Subject to any disclaimer, the term of this patent is extended or adjusted under 35 U.S.C. 154(b) by 0 days.

(21) Appl. No.: 19/204,831

(22) Filed: May 12, 2025

(65) Prior Publication Data

US 2025/0349520 A1 Nov. 13, 2025

(30) Foreign Application Priority Data

May 13, 2024 (KR) ........................ 10-2024-0062656
Aug. 21, 2024 (KR) ........................ 10-2024-0112147
Apr. 28, 2025 (KR) ........................ 10-2025-0055371

(51) Int. Cl.
*H01J 37/32* (2006.01)

(52) U.S. Cl.
CPC .............................. *H01J 37/32568* (2013.01)

(58) Field of Classification Search
CPC ............ H01J 37/3244; H01J 37/32568; H01J 37/32715; H01J 37/32862; H01J 37/32532; H01J 2237/20235; H01J 2237/3321; H01J 2237/334; H01J 37/32091; H01J 37/32513; H01J 37/32825; H01J 2237/2007; H01J 2237/20214; H01J 2237/20292; H01J 37/32082; H01J 37/32183; H01J 37/3222; H01J 37/32229; H01J 37/32247; H01J 37/32431; H01J 37/32449; H01J 37/32495; H01J 37/32559; H01J 37/32724;

(Continued)

(56) References Cited

U.S. PATENT DOCUMENTS 8,043,470 B2 * 10/2011 Hardin ............. H01J 37/32605 156/345.47
8,221,582 B2 * 7/2012 Patrick ............... C23C 16/4557 403/348

(Continued)

FOREIGN PATENT DOCUMENTS

JP 2011521472 A 7/2011
JP 3189241 U 3/2014

(Continued)

*Primary Examiner* — Monica C King
(74) *Attorney, Agent, or Firm* — HoustonHogle LLP

(57) ABSTRACT

The present disclosure relates to an upper electrode assembly. The upper electrode assembly comprises a bush assembly fastened to an insertion hole of a plasma electrode plate, and a lift bar received in a receiving space of an electrode support plate and configured to detachably couple the plasma electrode plate to the electrode support plate. The bush assembly comprises a bush configured to be coupled to the lift bar. The lift bar comprises a coupling portion configured to couple with the bush. The coupling portion comprises a bush insertion groove into which the bush is inserted, a first path configured to allow the lift bar to move in an axial direction with the bush inserted, and a second path configured to allow the lift bar to rotate with the bush positioned at an end of the first path.

11 Claims, 20 Drawing Sheets

(58) Field of Classification Search
CPC ........... H01J 37/32807; H01J 2237/022; H01J 2237/2005; H01J 37/32477; H01J 37/32541; H01J 37/32642; H01J 37/32899
See application file for complete search history.

(56) References Cited

U.S. PATENT DOCUMENTS

| | | | | |
|---|---|---|---|---|
| 8,272,346 | B2 | 9/2012 | Battencourt et al. | |
| 8,573,152 | B2 * | 11/2013 | de la Llera ............ | H01R 13/20 156/345.46 |
| 8,628,268 | B2 | 1/2014 | Kellogg et al. | |
| 9,773,647 | B2 | 9/2017 | Matsuura et al. | |
| 10,449,577 | B2 | 10/2019 | Hashimoto | |
| 10,811,234 | B2 | 10/2020 | Matsuura et al. | |
| 2005/0116167 | A1 * | 6/2005 | Izaki ....................... | H01T 23/00 250/324 |
| 2009/0126633 | A1 | 5/2009 | Hardin et al. | |
| 2019/0096636 | A1 * | 3/2019 | Nam ................. | H01J 37/32128 |
| 2023/0032767 | A1 | 2/2023 | Park | |

FOREIGN PATENT DOCUMENTS

| | | | |
|---|---|---|---|
| JP | 2016018768 | A | 2/2016 |
| JP | 2016018769 | A | 2/2016 |
| KR | 101183509 | B1 | 9/2012 |
| KR | 101708060 | B1 | 2/2017 |
| KR | 102128596 | B1 | 7/2020 |
| KR | 102195927 | B1 | 12/2020 |
| TW | M396482 | U | 1/2011 |
| TW | 201740488 | A | 11/2017 |

* cited by examiner

UPPER ELECTRODE ASSEMBLY

CROSS-REFERENCE TO RELATED APPLICATION

The present application claims priority to and the benefit of Korean Patent Applications No. 10-2024-0062656, filed on May 13, 2024, No. 10-2024-0112147, filed on Aug. 21, 2024, and No. 10-2025-0055371, filed on Apr. 28, 2025, the entire content of which is hereby incorporated by reference.

BACKGROUND

The present disclosure relates to an upper electrode assembly, and more particularly, to an upper electrode assembly configured to enhance coupling force when coupling a plasma electrode plate to an electrode support plate using a lift bar, and to enable rapid and convenient fastening.

The semiconductor device can be manufactured through various processes. For example, the semiconductor device can be manufactured by performing photolithography, etching, and deposition processes on a wafer made of silicon or the like. In each process for manufacturing semiconductor device, plasma-state materials can be used. In processes using plasma, electrodes for generating and controlling plasma may be used in semiconductor manufacturing equipment. Electrodes for plasma may be located at the bottom and top of the chamber, respectively. Electrodes for a plasma may be formed by combining a plurality of elements.

Conventionally, to fix a plasma plate to the equipment, a fastening structure combining an electrode plate having an insertion groove, a bush, and a fastening member (e.g., a bolt) has generally been used. However, such fastening structures may result in poor workability during fastening and unfastening of the plasma electrode plate, and may also lead to problems such as reduced flatness or adhesion of the electrode plate due to unbalanced fastening force.

SUMMARY

The present disclosure may provide a lift bar-based upper electrode assembly which improves workability in fastening and unfastening a plasma electrode plate to and from equipment and maintains a consistent fastening force, thereby addressing the aforementioned problems.

An embodiment of the present disclosure may provide an upper electrode assembly, including a bush assembly fastened to an insertion hole of a plasma electrode plate, and a lift bar received in receiving space of an electrode support plate and configured to detachably couple the plasma electrode plate to the electrode support plate.

The bush assembly may include a bush configured to be coupled to the lift bar. The lift bar may include a coupling portion configured to couple with the bush. The coupling portion may include a bush insertion groove into which the bush is inserted, a first path configured to allow the lift bar to move in an axial direction with the bush inserted, and a second path configured to allow the lift bar to rotate with the bush positioned at an end of the first path.

DETAILED DESCRIPTION OF EMBODIMENTS

Figure 1:
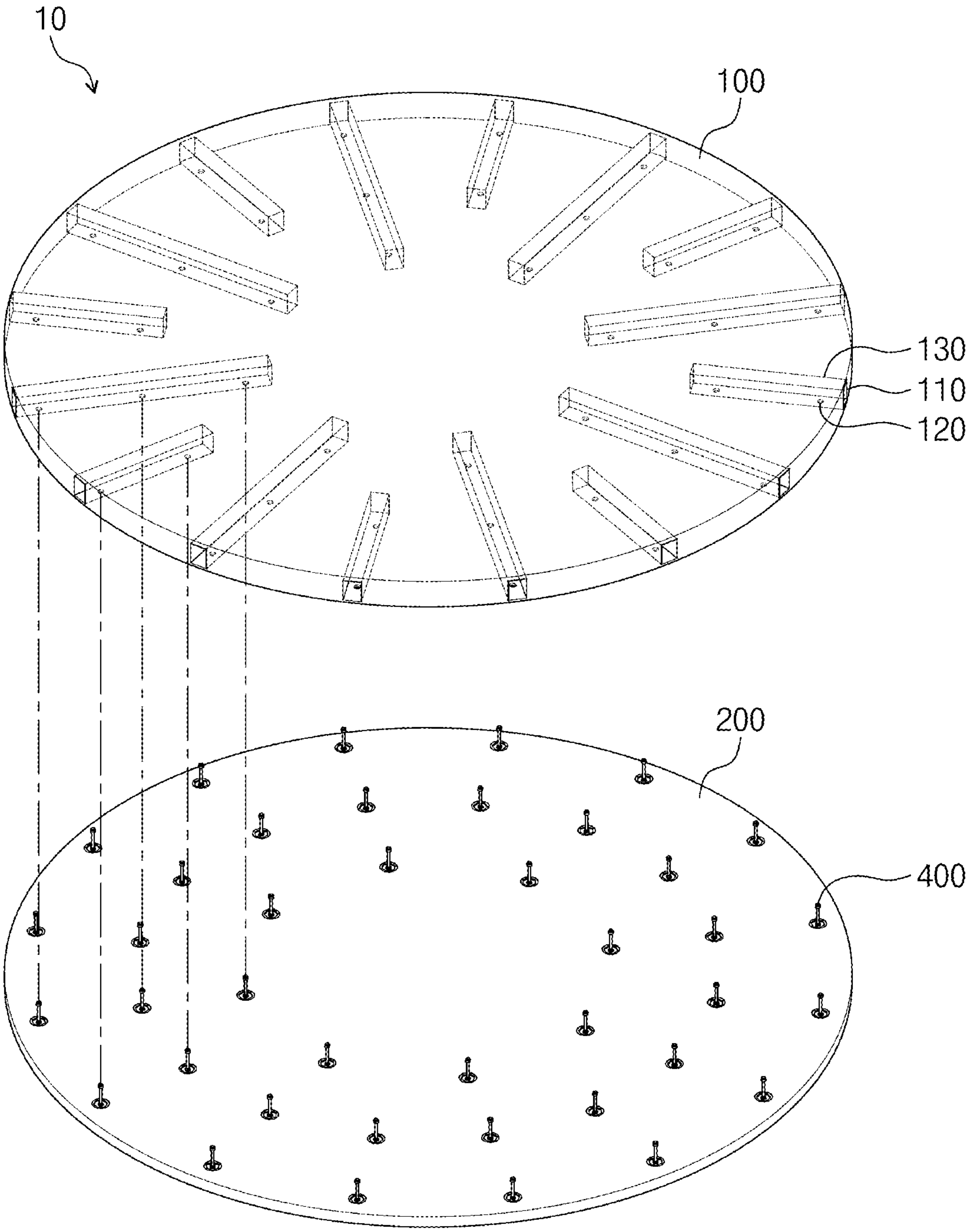
FIG. 1 is a partially exploded perspective view of an upper electrode assembly according to embodiments of the present disclosure.

To fully understand the configuration and effects of the present disclosure, some embodiments will be described with reference to the accompanying drawings. However, the present disclosure is not limited to the following exemplary embodiments and may be implemented in various forms. The exemplary embodiments are provided solely to illustrate the present disclosure and to enable those skilled in the art to fully understand its scope.

In this description, when an element is described as being "on" another element, it may be directly on the other element, or one or more intervening elements may be present. In the drawings, certain thicknesses may be exaggerated to better illustrate technical details. Throughout the specification, like reference numerals indicate like elements.

The embodiments described herein may be illustrated using perspective, sectional and/or plan views, which are presented as idealized examples of the present disclosure. The thicknesses of layers and regions in the drawings may be exaggerated for clarity. The regions shown in the drawings are for illustrative purposes and should not be construed as limiting the scope of the present disclosure. Although terms such as "first," "second," and "third" may be used to describe various elements, these terms are merely for distinction and do not imply any particular order or hierarchy. The embodiments described and illustrated herein include complementary variations.

The terms used in this description serve only to explain various embodiments and are not intended to limit the present disclosure. Unless explicitly stated otherwise, singular forms may also include plural forms. The terms "comprises/includes" and "comprising/including" do not exclude the presence or addition of one or more other components.

Figure 2:
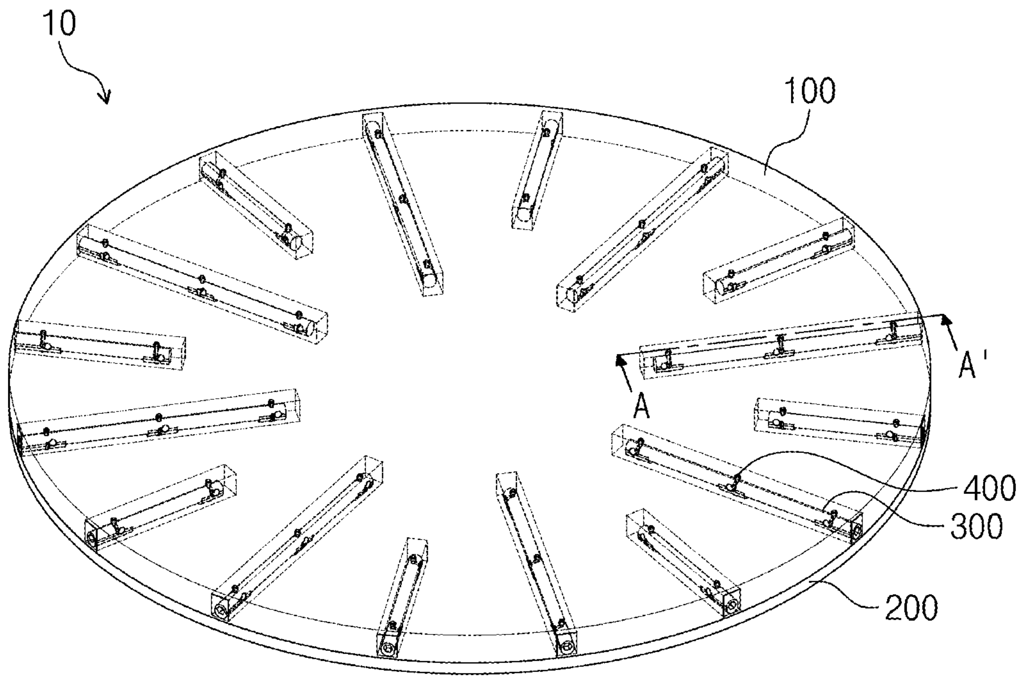
FIG. 2 is an assembled view of an upper electrode assembly according to embodiments of the present disclosure.

Referring to FIGS. 1 and 2, an upper electrode assembly 10 according to an embodiment of the present disclosure may include an electrode support plate 100, a plasma electrode plate 200, a lift bar 300, and a bush assembly 400.

The upper electrode assembly 10 may be installed in a chamber for a process using plasma. For example, the upper electrode assembly 10 may be installed in a chamber for semiconductor etching. More specifically, the upper electrode assembly 10 may be an electrode installed above and spaced apart from a lower electrode within the etching chamber.

The electrode support plate 100 may serve as an upper structural component of the equipment and may be formed in a disk-shaped structure. An opening 110 for insertion of the lift bar 300 may be formed on a side of the electrode support plate 100. A through-groove 120 may be formed on lower portion of the electrode support plate 100. The through-groove 120 may receive the bush assembly 400 that is inserted into and fastened to the plasma electrode plate 200. A receiving space 130 may be formed inside the electrode support plate 100. The receiving space 130 may be configured to accommodate components such as a lift bar 300 and a bush assembly 400. The receiving space 130 may have a three-dimensional shape such as a rectangular parallelepiped or a cylinder, although it is not limited to such shapes.

The plasma electrode plate 200 may include a ceramic material such as silicon, silicon carbide, alumina, or quartz. The plasma electrode plate 200 may be formed in a disk-shaped structure. In addition, the upper surface of the plasma electrode plate 200 may be formed to be flat to ensure close contact with the electrode support plate 100.

An insertion hole 210 penetrating through the upper surface of the plasma electrode plate 200 may be formed on the plasma electrode plate 200. The bush assembly 400 may be inserted into the insertion hole 210. The bush assembly 400 may be inserted into the insertion hole 210 to mechanically connect the plasma electrode plate 200 to the upper electrode support plate 100. A plurality of insertion holes 210 may be provided. The plurality of insertion holes 210 may be spaced apart from each other in a circumferential direction. A plurality of bush assemblies 400 may be provided. For example, the number of bush assemblies 400 may correspond to the number of insertion holes 210. The plurality of bush assemblies 400 may be respectively inserted into the plurality of insertion holes 210.

The plasma electrode plate 200 may include a plurality of nozzles provided on its surface. The nozzle may be configured to supply a process gas. For example, the plasma electrode plate 200 may be a shower head.

The plasma electrode plate 200 may also include a plurality of micro-holes. The micro-holes may allow process gas to pass through, although they are not limited thereto.

Figure 3A:
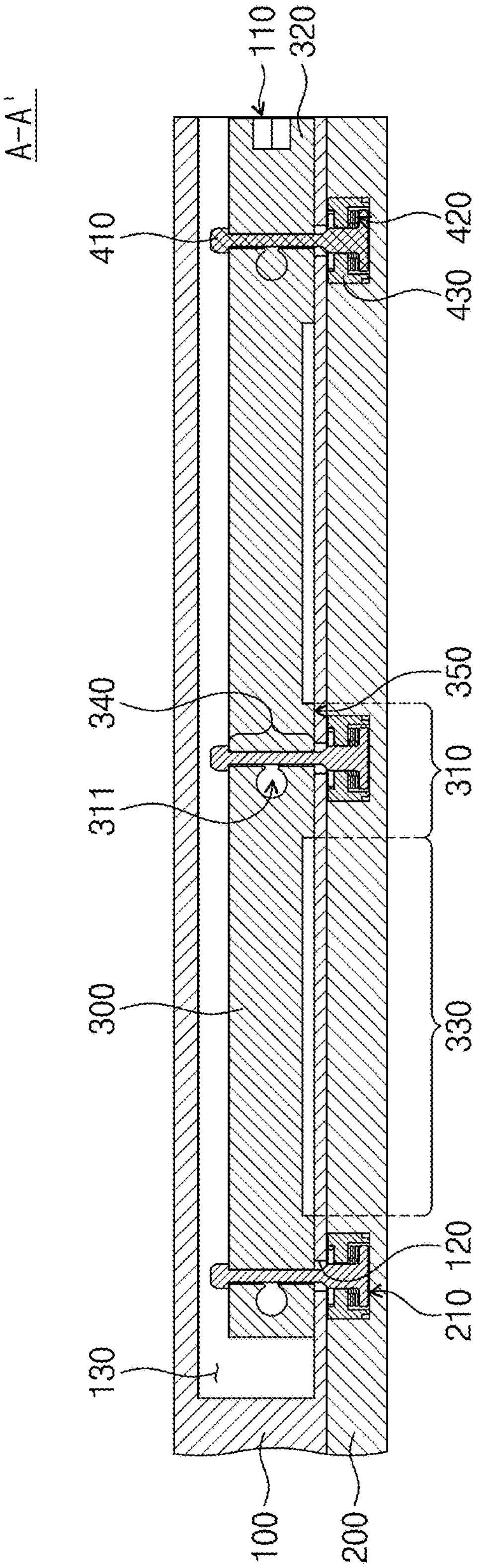
FIG. 3A is a cross-sectional view of an assembled upper electrode assembly according to embodiments of the present disclosure.
Figure 3B:
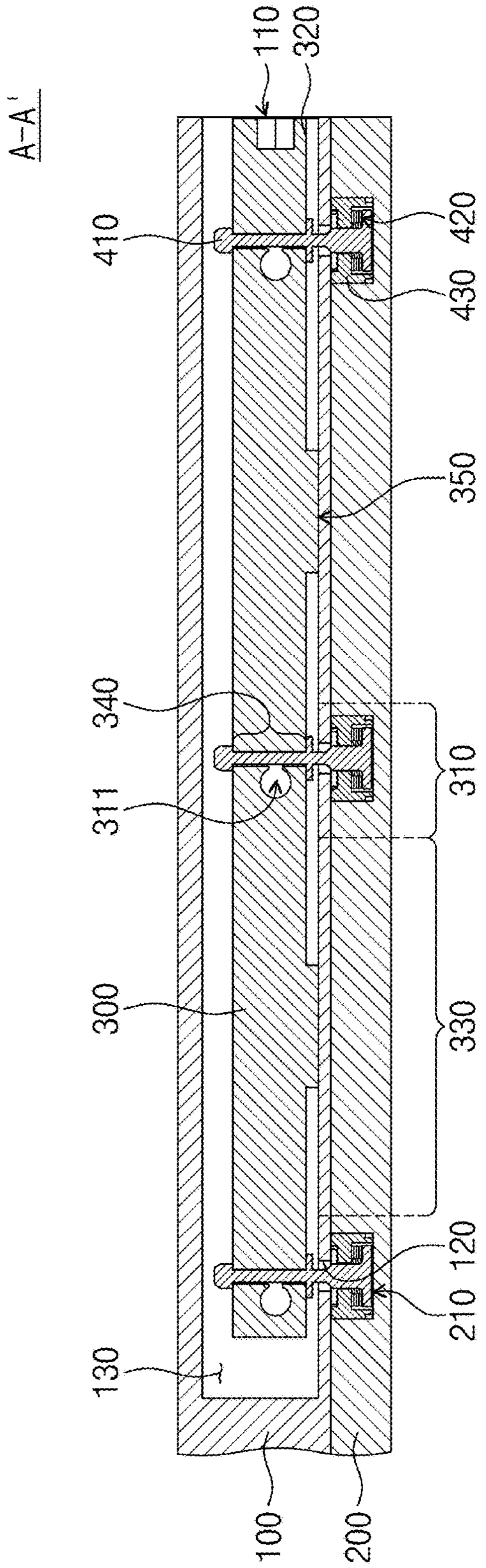
FIG. 3B is a cross-sectional view of another assembled upper electrode assembly according to embodiments of the present disclosure.

FIG. 3A is a cross-sectional view showing a section taken along line A-A' of the upper electrode assembly 10 in the assembled state as shown in FIG. 2, according to an embodiment of the present disclosure. FIG. 3B is a cross-sectional view showing a section taken along line A-A' of the upper electrode assembly 10 in the assembled state, according to another embodiment of the present disclosure. FIGS. 4A to 4H are perspective and plan views showing various views of the lift bar 300 from different directions. FIGS. 5A to 5D are views illustrating the assembled and disassembled states of the bush assembly 400. Referring to these drawings, the structural shapes of the lift bar 300 and the bush assembly 400, and their coupling relationship can be understood in more detail.

Referring to FIG. 3A and FIGS. 5A to 5C, a bush assembly 400 according to an embodiment of the present disclosure may include a bush 410, a washer 420, and a bush fastening member 430. The bush 410 may include a bush body 412, a bush head 411, and a fastening portion 413.

The fastening portion 413 may be formed at a lower portion of the bush body 412. The fastening portion 413 may be disposed in the insertion hole 210 of the plasma electrode plate 200. The fastening portion 413 may be fastened by the bush fastening member 430 in the insertion hole 210. When the bush 410 is fastened to the plasma electrode plate 200, the washer 420 may be interposed between the fastening portion 413 and the bush fastening member 430. The washer 420, interposed between the fastening portion 413 and the bush fastening member 430, may serve to maintain fastening height, ensure fastening force, and absorb vibrations. A plurality of washers 420 may be provided.

The bush body 412 may be formed to extend upward from the fastening portion 413. The bush body 412 may be inserted into the receiving space 130 through the through-groove 120 of the electrode support plate 100. The bush body 412 may have a cylindrical shape or the like, and may be inserted into a bush insertion groove 311 of a coupling portion 310 of the lift bar 300.

The bush head 411 having a spherical or disc shape may be formed at an upper portion of the bush body 412, although it is not limited thereto. The bush head 411 may have a larger diameter than the bush body 412. The bush head 411 may be inserted into the receiving space 130 through the through-groove 120 of the electrode support plate 100. In addition, the bush head 411 may be inserted into a bush insertion groove 311 of the coupling portion 310 of the lift bar 300. When the plasma electrode plate 200 is fastened to the electrode support plate 100, the bush head 411 may be positioned on an upper portion of a bush fixing portion 340 of the lift bar 300.

Figure 5A:
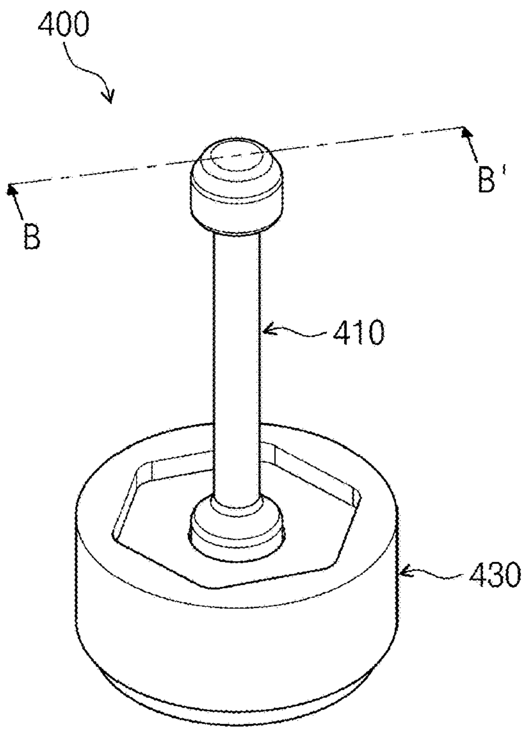
FIG. 5A is a perspective view of a bush assembly in assembled state according to embodiments of the present disclosure.
Figure 5B:
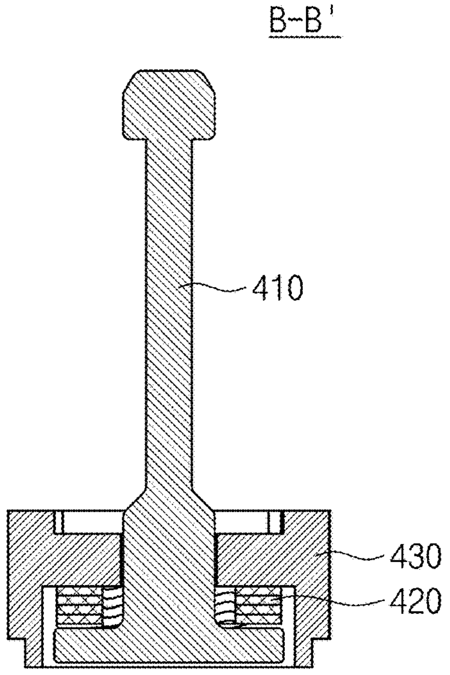
FIG. 5B is a cross-sectional view of a bush assembly in assembled state according to embodiments of the present disclosure.
Figure 5C:
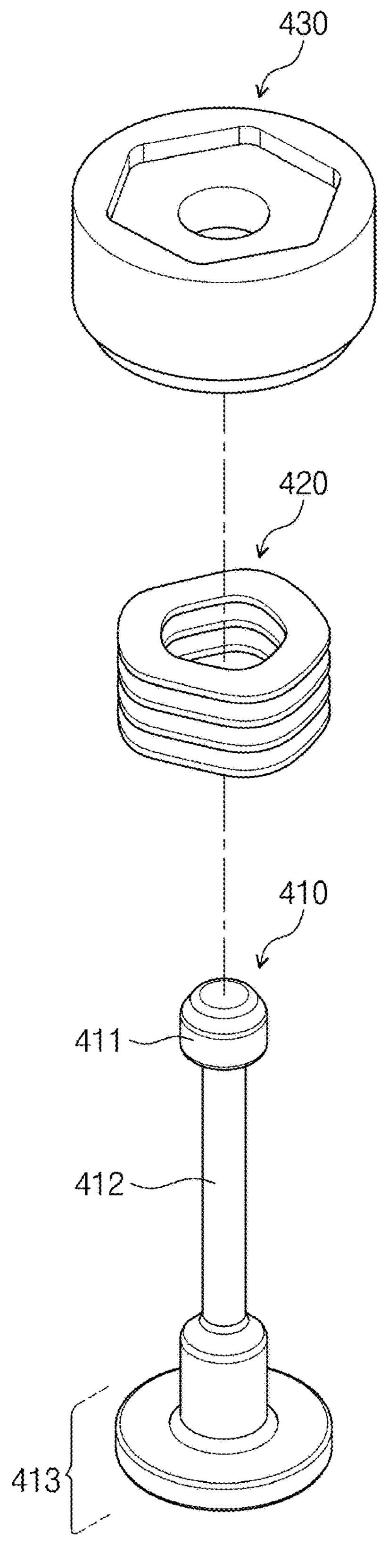
FIG. 5C is an exploded view of a bush assembly according to embodiments of the present disclosure.
Figure 5D:
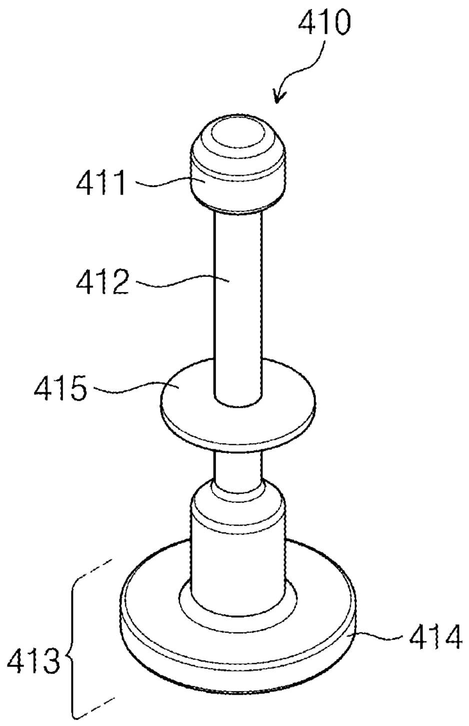
Figure 6:
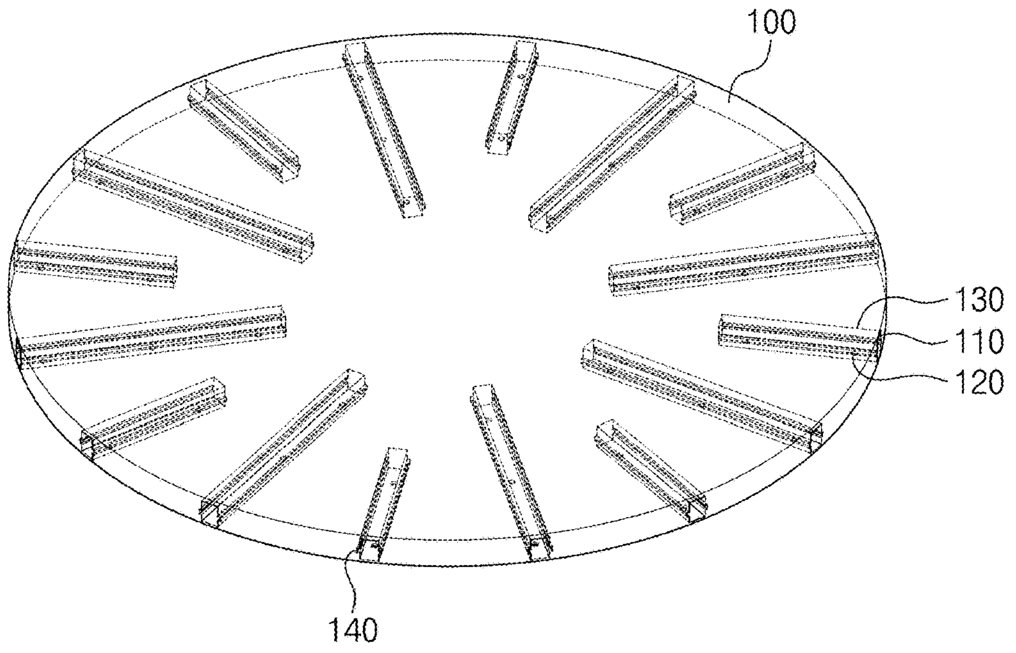
FIG. 6 is a perspective view of an electrode support plate further including a rib insertion groove according to embodiments of the present disclosure.
Figure 7:
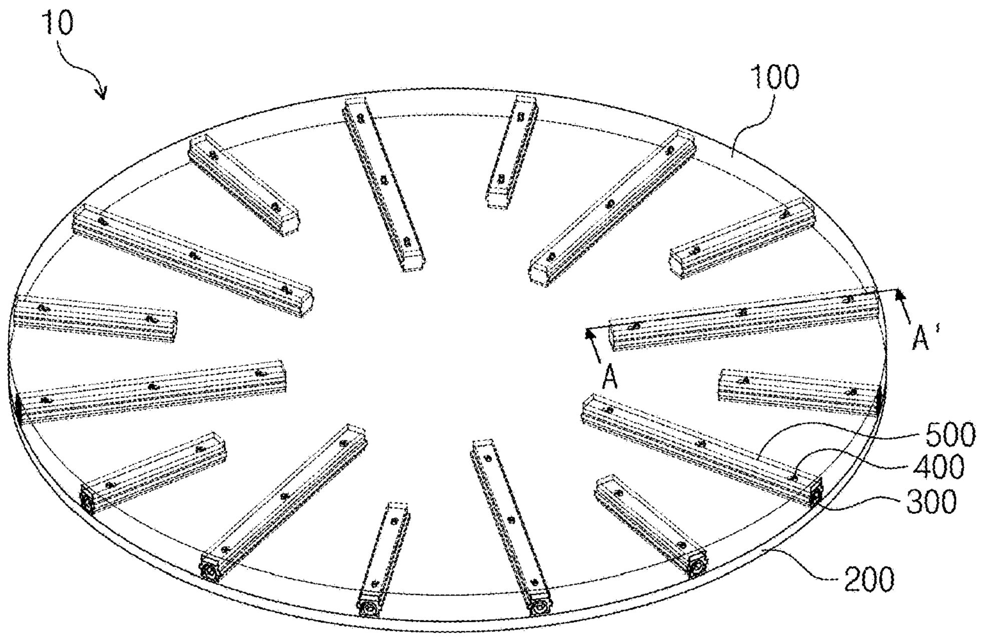
FIG. 7 is a perspective view of upper electrode assembly, including a lift bar guide unit, in assembled state according to embodiments of the present disclosure.
Figure 8:
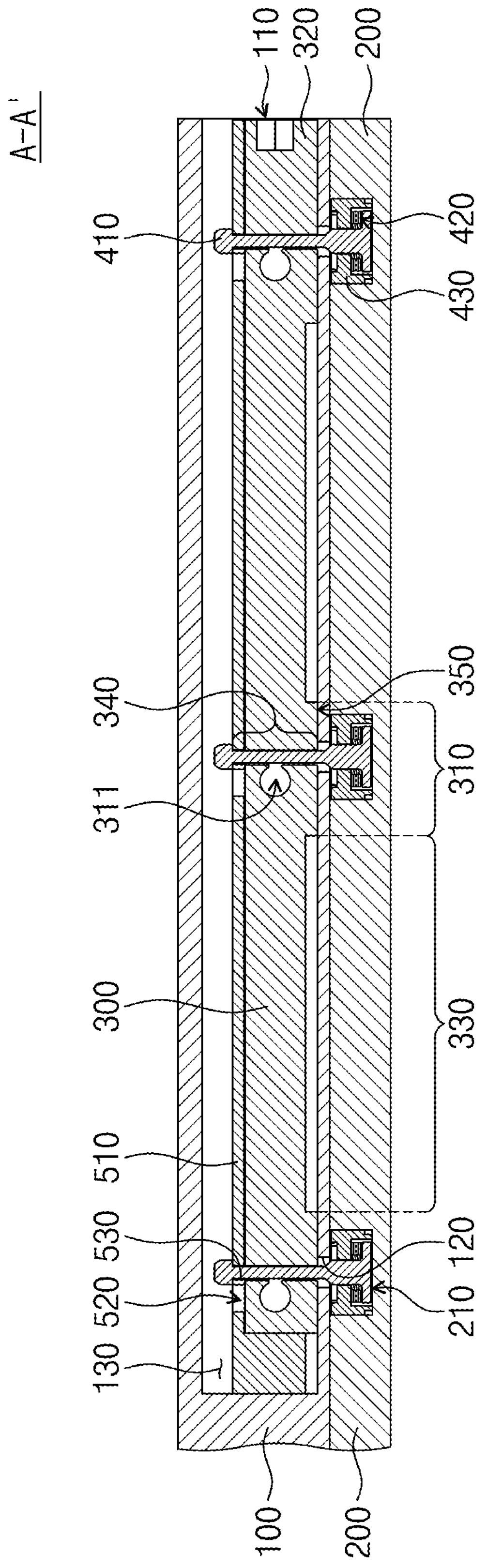
FIG. 8 is a cross-sectional view of upper electrode assembly, including a lift guide unit, in assembled state according to embodiments of the present disclosure.
Figure 9A:
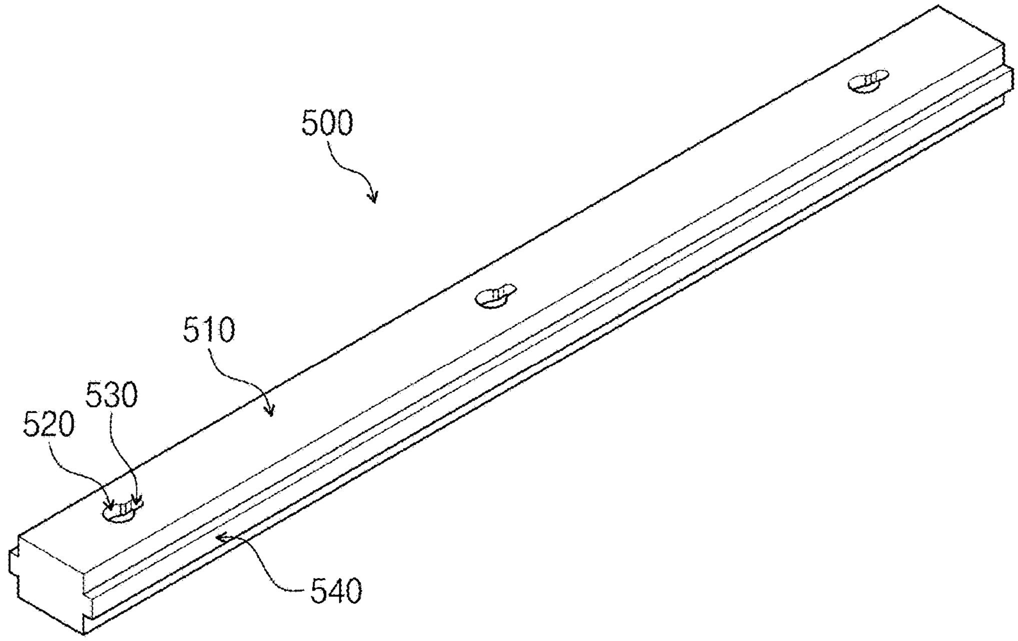
FIG. 9A is a perspective view of a lift bar guide unit according to embodiments of the present disclosure.
Figure 9B:
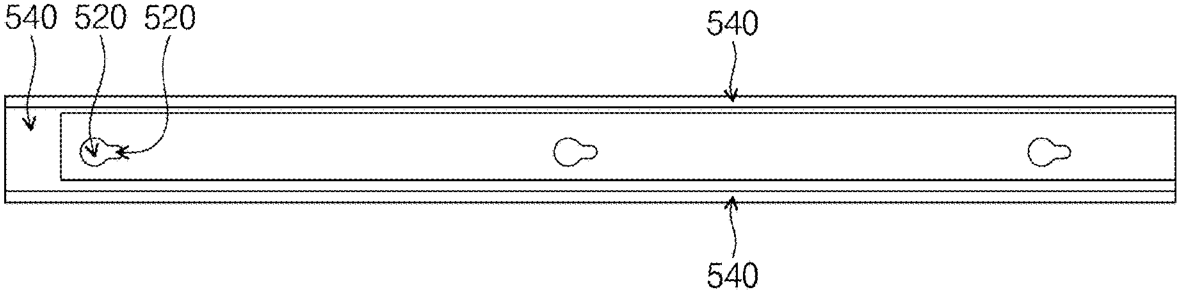
FIG. 9B is a bottom view of a lift bar guide unit according to embodiments of the present disclosure.

Referring to FIGS. 3B and 5D, the bush 410 may further include a protrusion 415 formed to protrude from the bush body 412. The fastening portion 413 may further include a support piece 414. The support piece 414 may be formed at the lowermost end of the fastening portion 414. The support piece 414 may come into close contact with the bottom surface of the insertion hole 210. The protrusion 415 may be in the form of a disk or a sphere, but is not limited thereto.

The protrusion 415 may have a larger diameter than the bush head 411 and may have a smaller diameter than the support piece 414 located at the lowermost end of the fastening portion 413. The protrusion 415 may be formed at a lower portion of the bush body 412. The protrusion 415 may interfere with other components, such as the lift bar 300, of the upper electrode assembly 10. Details of the protrusion 415 will be described below.

Referring to FIG. 3, the lift bar 300 according to an embodiment of the present disclosure may be inserted through the opening 110 of the electrode support plate 100 and accommodated in receiving space 130. The lift bar 300 may serve to detachably couple the plasma electrode plate 200 to the electrode support plate 100. The lift bar 300 may be disposed in contact with the upper surface of the lower portion of the receiving space 130 to provide a uniform fastening force and to ensure adhesion and flatness of the plasma electrode plate 200. The lift bar 300 may be formed in a cylindrical shape or the like.

Referring to FIGS. 3 and 4, the lift bar 300 may include a coupling portion 310, an operation portion 320, a body portion 330, a bush fixing portion 340, and a lift portion 350. The operation portion 320 may be disposed adjacent to the opening 110 of the electrode support plate 100. The lift bar 300 may be axially movable and rotatable within the receiving space 130 by the operating portion 320. An axial direction may be a direction from the opening 110 of the electrode support plate 100 toward the center of the electrode support plate 100. The lift bar 300 may be movable along the axial direction. The axial direction may be illustratively represented as the A-A' direction shown in FIG. 2. The body portion 330 may be formed in the shape of a bar extending the axial direction of the lift bar 300. The body portion 330 may serve as a structural center that supports the axial movement and rotation of the lift bar 300. The body portion 330 may have cylindrical shape or the like, although it is not limited thereto. A plurality of body portions 330 may be provided.

The coupling portion 310 may be a region where the lift bar 300 and the bush assembly 400 are coupled, and may include a bush insertion groove 311, a first path 312, and a second path 313. The coupling portion 310 may have a cylindrical shape or the like, although it is not limited thereto. A plurality of coupling portions 310 may be provided. The body portion 330 may be disposed between the plurality of coupling portions 310.

Referring to FIGS. 3A and 4, the lift portion 350 according to an embodiment of the present disclosure may protrude from a side surface of the coupling portion 310, although it is not limited thereto. The lift portion 350 may have a semi-circular shape or the like, but it is not limited thereto. The lift portion 350 may come into contact with a lower surface of the electrode support plate 100 when the lift bar 300 is rotated. As the lift portion 350 comes into contact with the lower surface of the electrode support plate 100, it may lift bar 300 upward from beneath the electrode support plate 100.

Figure 4A:
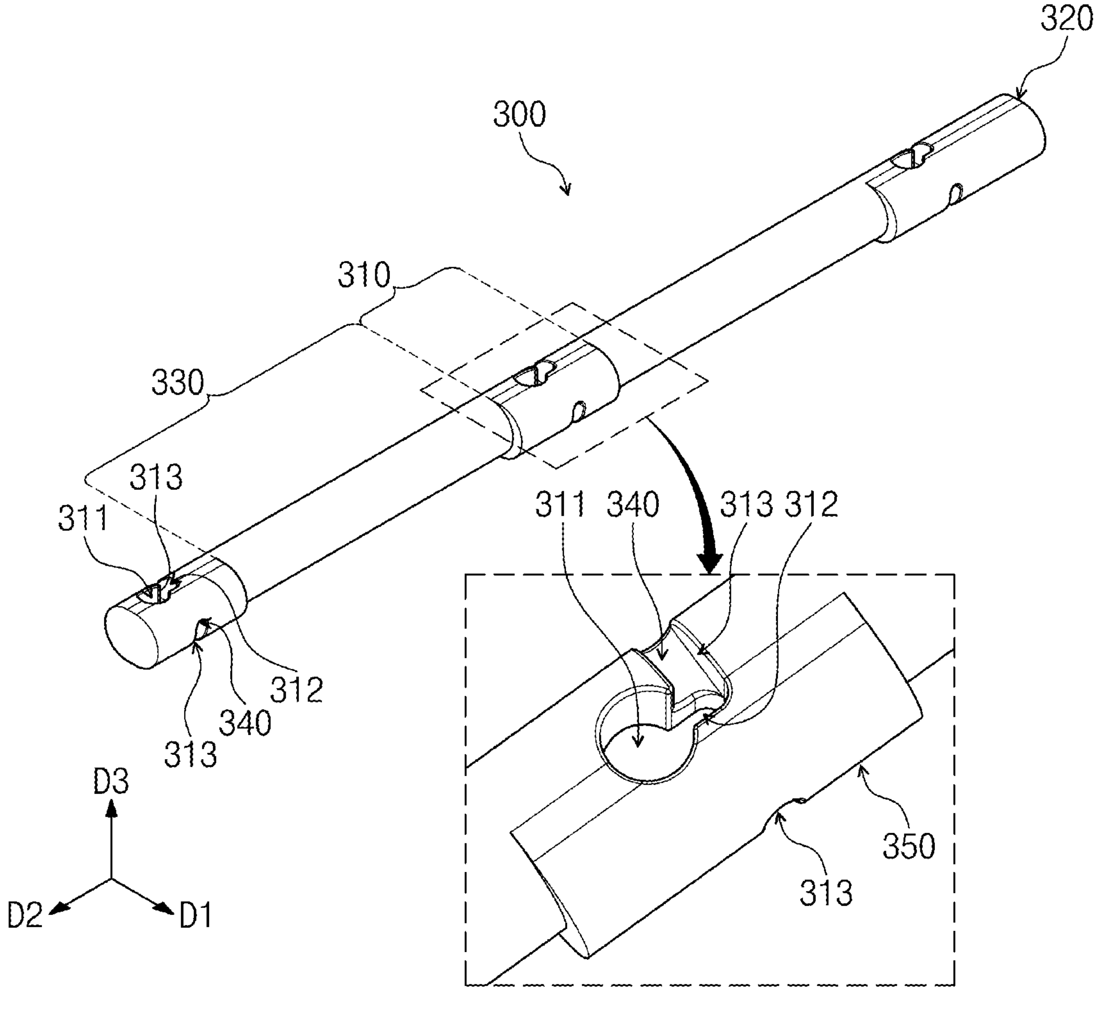
FIG. 4A is a perspective view and an enlarged view of a lift bar according to embodiments of the present disclosure.
Figure 4B:
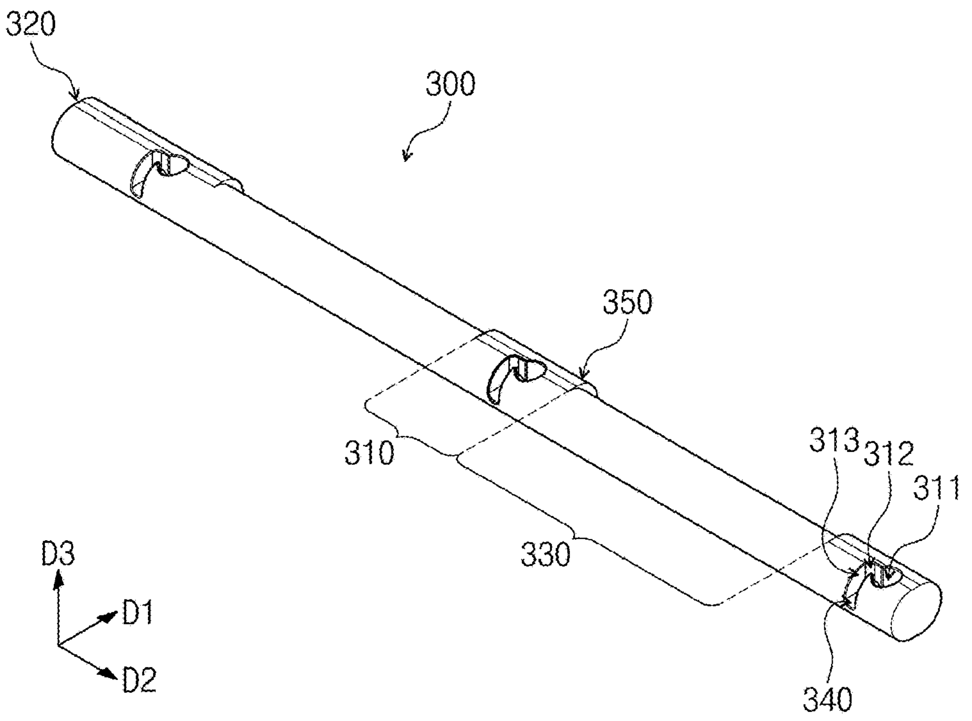
FIG. 4B is a left-side perspective view of a lift bar according to embodiments of the present disclosure.
Figure 4C:
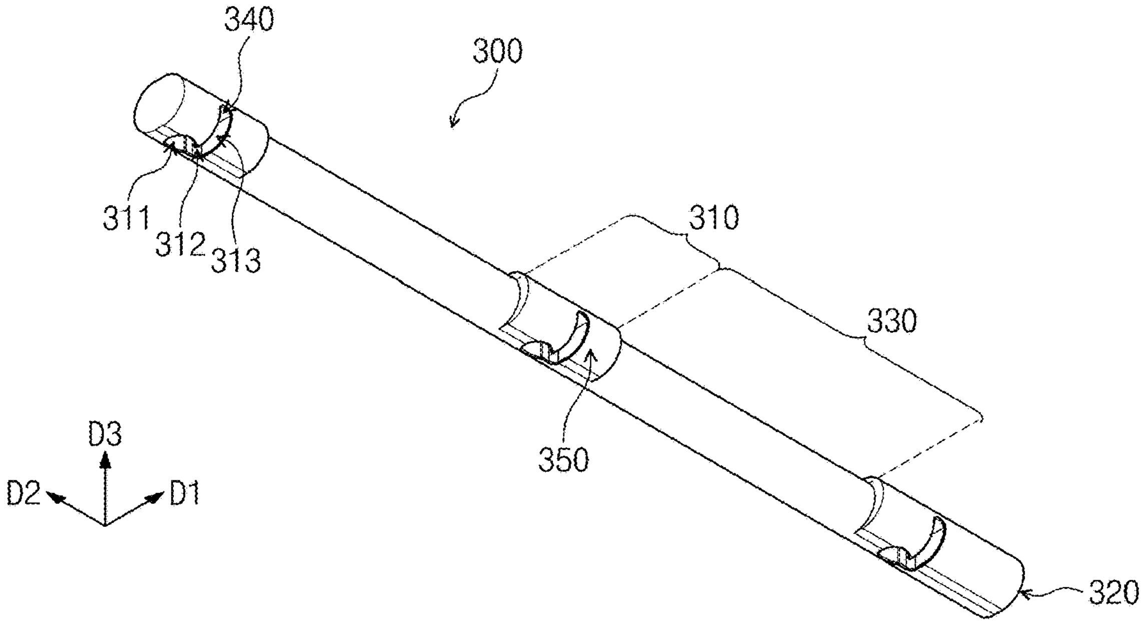
FIG. 4C is a bottom-side perspective view of a lift bar according to embodiments of the present disclosure.
Figure 4D:
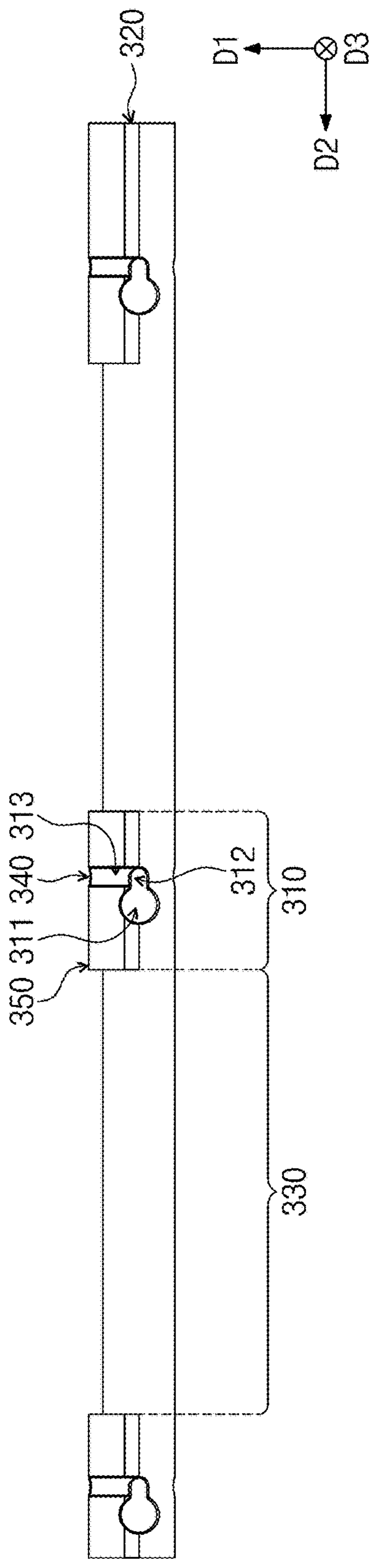
FIG. 4D is a bottom view of a lift bar according to embodiments of the present disclosure.
Figure 4E:
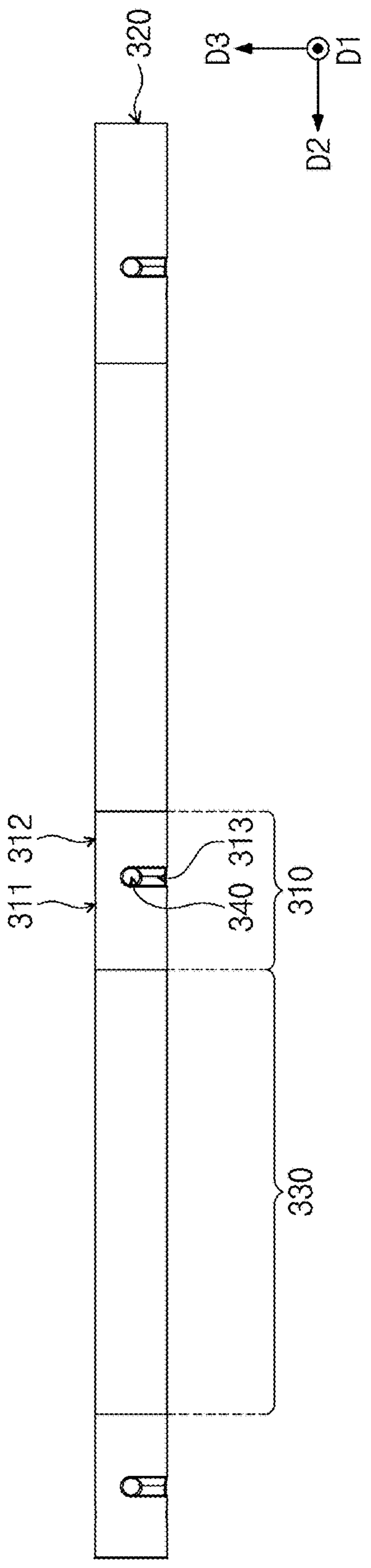
FIG. 4E is a right-side view of a lift bar according to embodiments of the present disclosure.
Figure 4F:
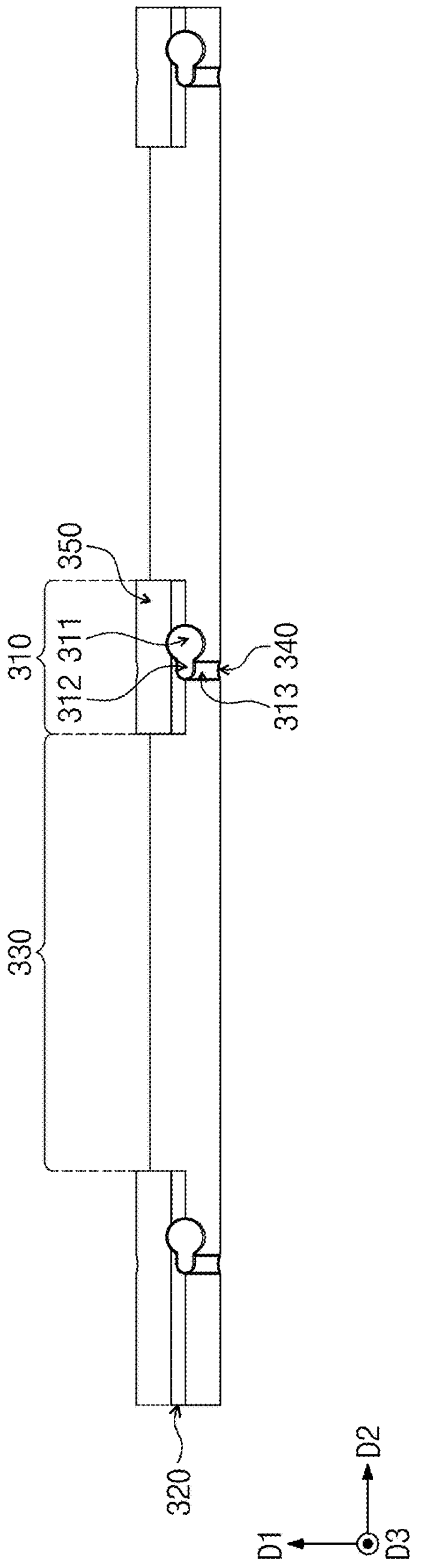
FIG. 4F is a top view of a lift bar according to embodiments of the present disclosure.
Figure 4G:
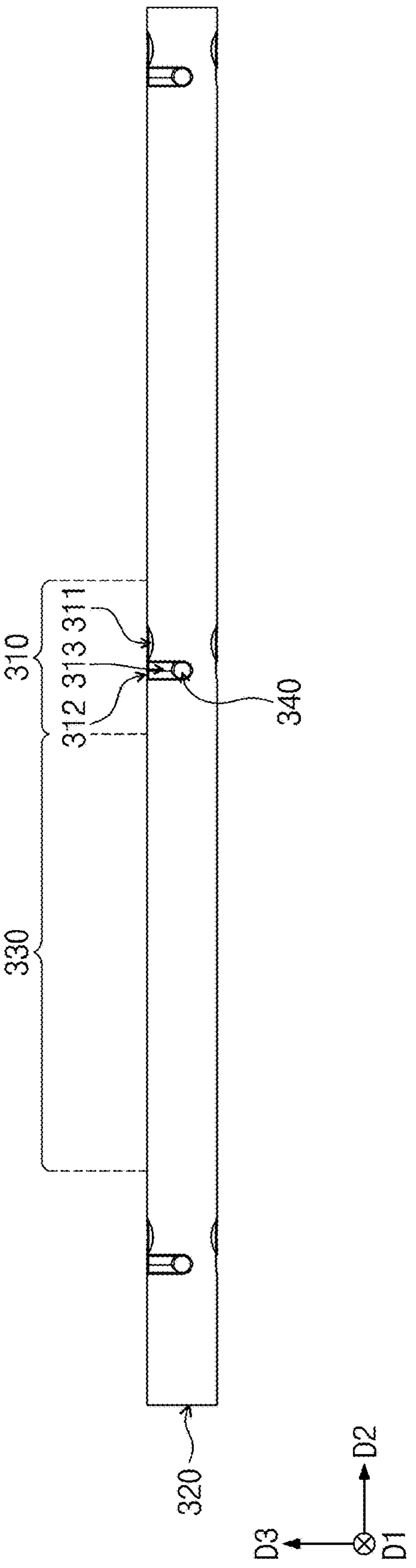
FIG. 4G is a left-side view of a lift bar according to embodiments of the present disclosure.
Figure 4H:
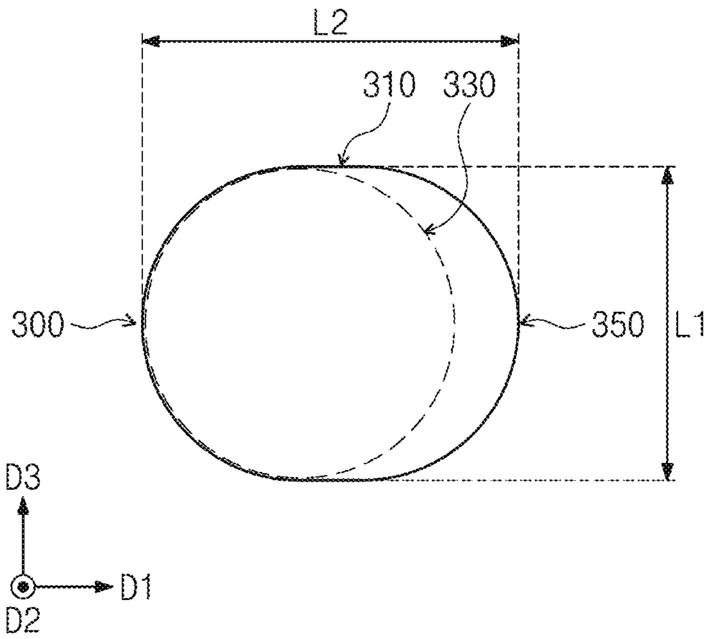
FIG. 4H is a front view of a lift bar according to embodiments of the present disclosure.

FIG. 4H is a front view of the lift bar 300 showing a state in which the lift portion 350 protrudes from the coupling portion 310. The diameter L2 of the coupling portion 310 including the lift portion 350 may be greater than a dimeter L1 of the body portion 330. When the lift bar 300 is rotated, the lift portion 350 may come into contact with a lower surface of the electrode support plate 100, thereby lifting the lift bar 300 upward. In this case, a height by which the lift bar 300 is raised may correspond to a difference between a diameter L2 of the coupling portion 310 including the lift portion 350 and a dimeter L1 of the body portion 330. As the lift bar 300 is lifted upward, the plasma electrode plate 200 may be brought into close contact with, and fastened to, a lower surface of the electrode support plate 100.

Referring to FIG. 3B, a lift portion 350 according to another embodiment of the present disclosure may be formed to protrude from a side surface of a body portion 330. In this case, a height by which the lift bar 300 is raised may correspond to difference between a diameter L1 of the body portion 330 including the lift portion 350 and a diameter L2 of the coupling portion 310. In an embodiment, a protrusion 415 may be formed on a lower portion of the bush body 412 at a height equal to or less than the lift height by which the lift bar 300 is raised from the lower surface of the electrode support plate 100. Accordingly, the protrusion 415 may limit the lift height of the lift bar 300 achieved via the lift portion 350.

The bush 410 of the bush assembly 400 may be inserted into the bush insertion groove 311. For example, the bush body 412 and the bush head 411 of the bush 410 may be inserted into the bush insertion groove 311.

The first path 312 may serve to allow the lift bar 300 to move in the axial direction while the bush 410 is inserted into the bush insertion groove 311. The first path 312 formed in the coupling portion 310 may be configured to allow the bush body 412 to pass therethrough. The first path 312 may have an open or through-type structure extending in the axial direction of the lift bar 300.

The second path 313 may be formed continuously from the end of the first path 123 and may have a structure such as a sectorial shape or a curved shape. The second path 313 may be configured to allow the bush body 412 to pass therethrough. The second path 313 may allow the lift bar 300 to rotate while the bush 410 is positioned at the end of the first path 312. The second path 313 may serve to guide the bush head 411 to be positioned above the bush fixing portion 340 as the lift bar 300 performs a rotational operation.

The bush fixing portion 340 may be configured to stably maintain a fastening state between the lift bar 300 and the bush assembly 400 by supporting the lower surface of the bush head 411 while the lift bar 300 is in the rotated position. The bush fixing portion 340 may also maintain a fixed state so as to prevent the lift bar 300 from rotating in the reverse direction.

Referring to FIGS. 6 to 9B, the upper electrode assembly 10 according to an embodiment of the present disclosure may further include a lift bar guide unit 500. The lift bar guide unit 500 may be disposed within the receiving space 130 of the electrode support plate 100. The lift bar guide unit 500 may serve to guide the lift bar 300 so that it can be inserted into a predetermined position.

The lift bar guide unit 500 may include a lift bar guide 510, a bush head insertion portion 520, and a bush head fixing portion 530. The lift bar guide 510 may provide an insertion space to guide the lift bar 300 to be inserted into a predetermined position.

The lift bar guide 510 may guide the axial movement and rotational positioning of the lift bar 300 to be accurately aligned within the receiving space 130 of the electrode support plate 100. The lift bar guide 510 may be formed in a shape such as rectangular parallelepiped case with an open bottom, but is not limited thereto. In addition, the lift bar guide 510 may further include a rib 540 protruding from an outer side surface thereof, and the rib 540 may be inserted into a rib insertion groove 140 formed on the side surface of the receiving space 130 of the electrode support plate 100, so that the entire lift bar guide unit 500 may be maintained in a precisely fixed state within the equipment.

The bush head insertion portion 520 and the bush head fixing portion 530 may be disposed on an upper surface of the lift bar guide 510. The bush head insertion portion 520 and the bush head fixing portion 530 may be formed in a circular shape or the like, but are not limited thereto. When the upper electrode assembly 10 further includes the lift bar guide unit 500, the bush head 411 may be positioned on top of the bush head insertion portion 520 and the bush head fixing portion 530.

Figure 10A:
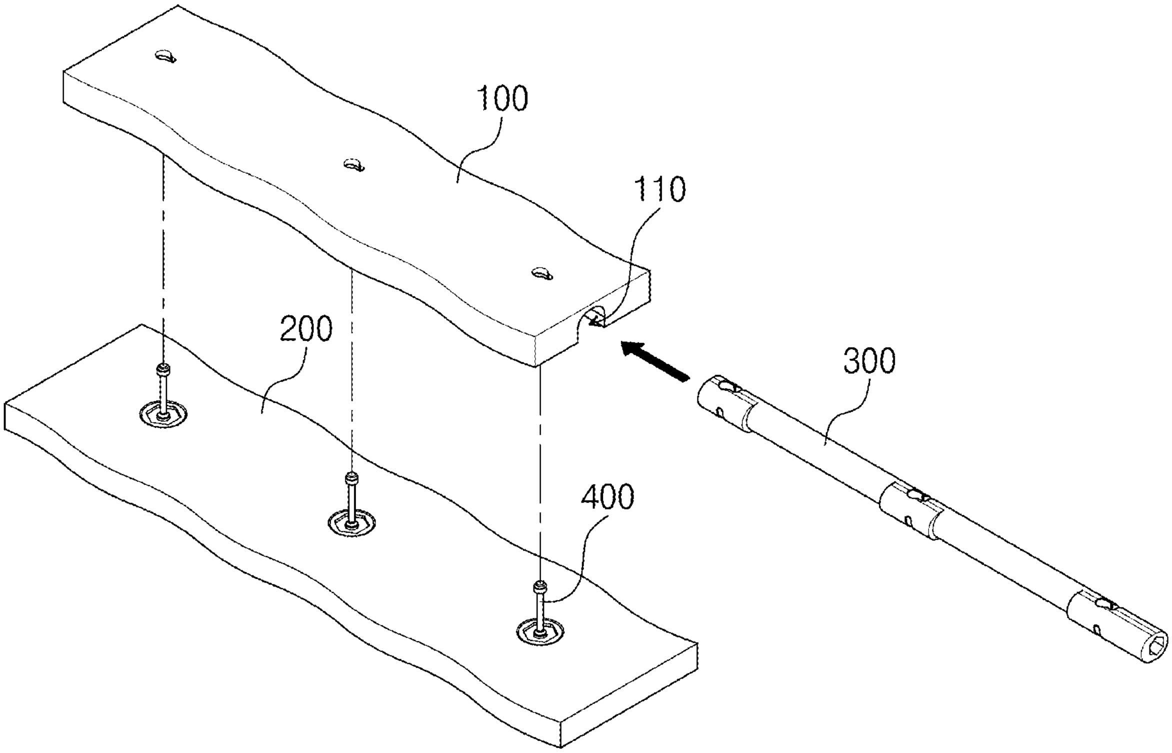
FIG. 10A is an exploded perspective view of a portion of an upper electrode assembly according to embodiments of the present disclosure.

Referring to FIGS. 10A to 10F, a fastening process of the upper electrode assembly 10 according to an embodiment of the present disclosure can be understood in more detail. FIG. 10A is an exploded perspective view showing a part of the upper electrode assembly 10 according to an embodiment of the present disclosure. FIGS. 10B to 10F are sequential views illustrating a process in which the plasma electrode plate 200, into which the bush assembly 400 is inserted, is brought into close contact with and fastened to the electrode support plate 100 through axial movement and rotation of the lift bar 300.

Referring to FIG. 10A, the upper electrode assembly 10 according to an embodiment of the present disclosure may include a lift bar 300. The lift bar 300 may be inserted through an opening 110 of the electrode support plate 100 and accommodated within the receiving space 130. In this state, the bush assembly 400, which is coupled to the plasma electrode plate 200, may be inserted into a through-groove 120 of the electrode support plate 100 and then into the bush insertion groove 311 of the lift bar 300.

Figure 10B:
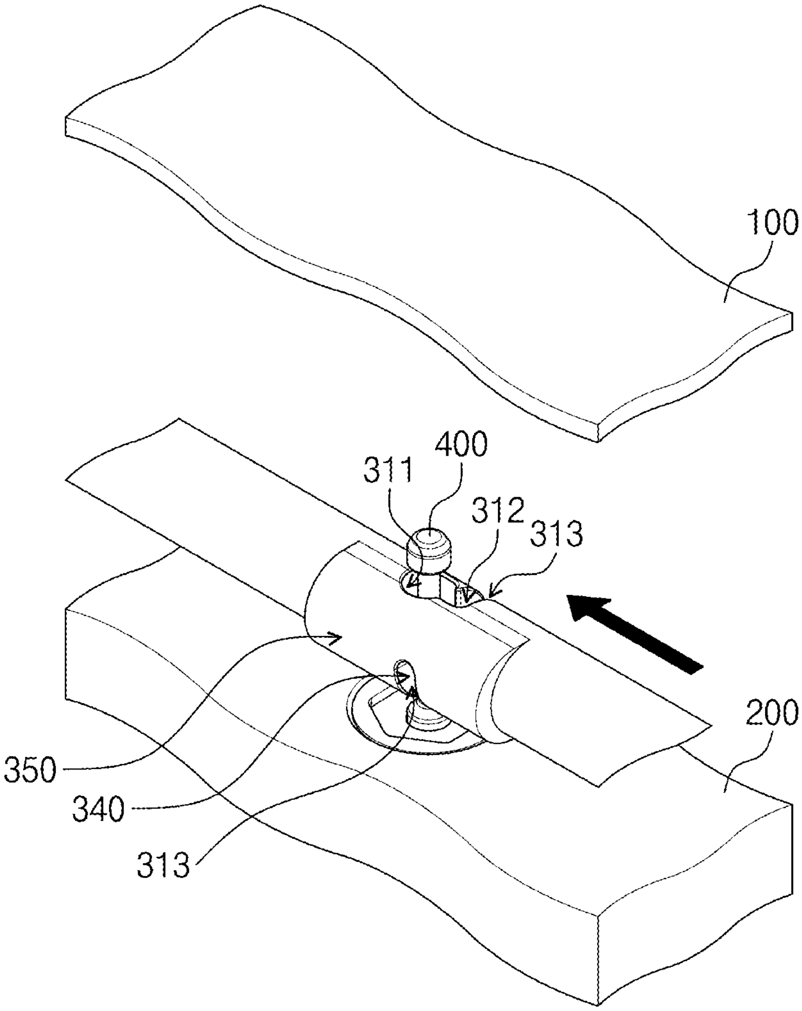
FIGS. 10B to 10E are perspective views sequentially illustrating a fastening process according to embodiments of the present disclosure.
Figure 10C:
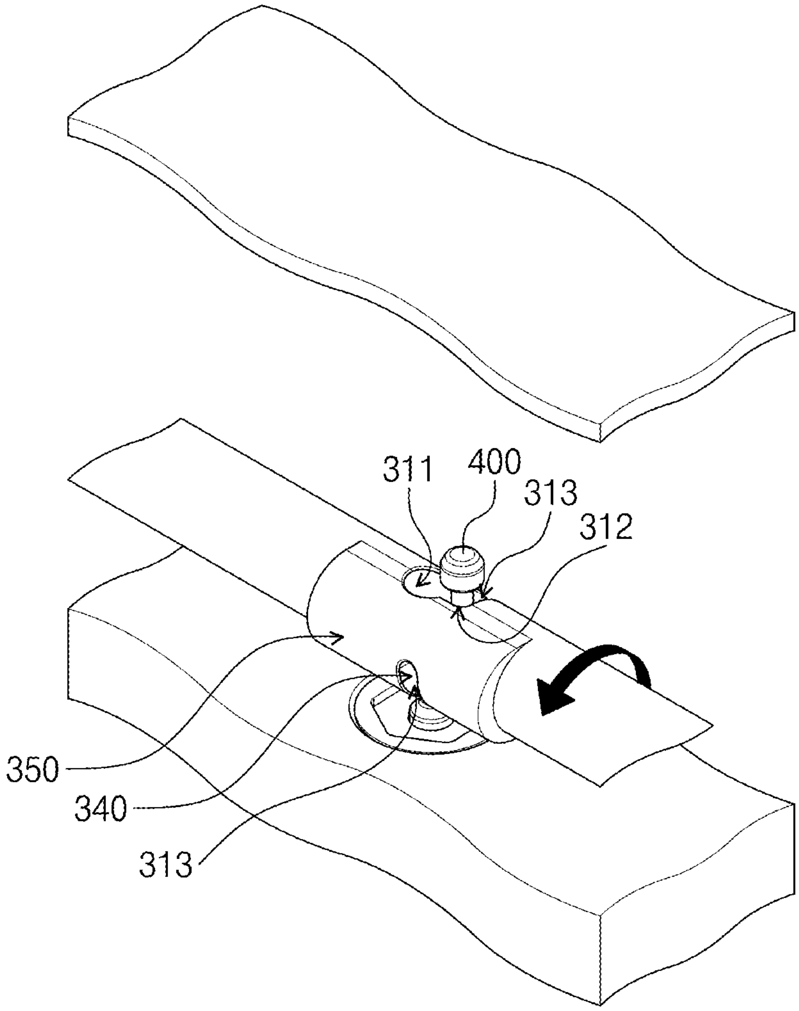
Figure 10D:
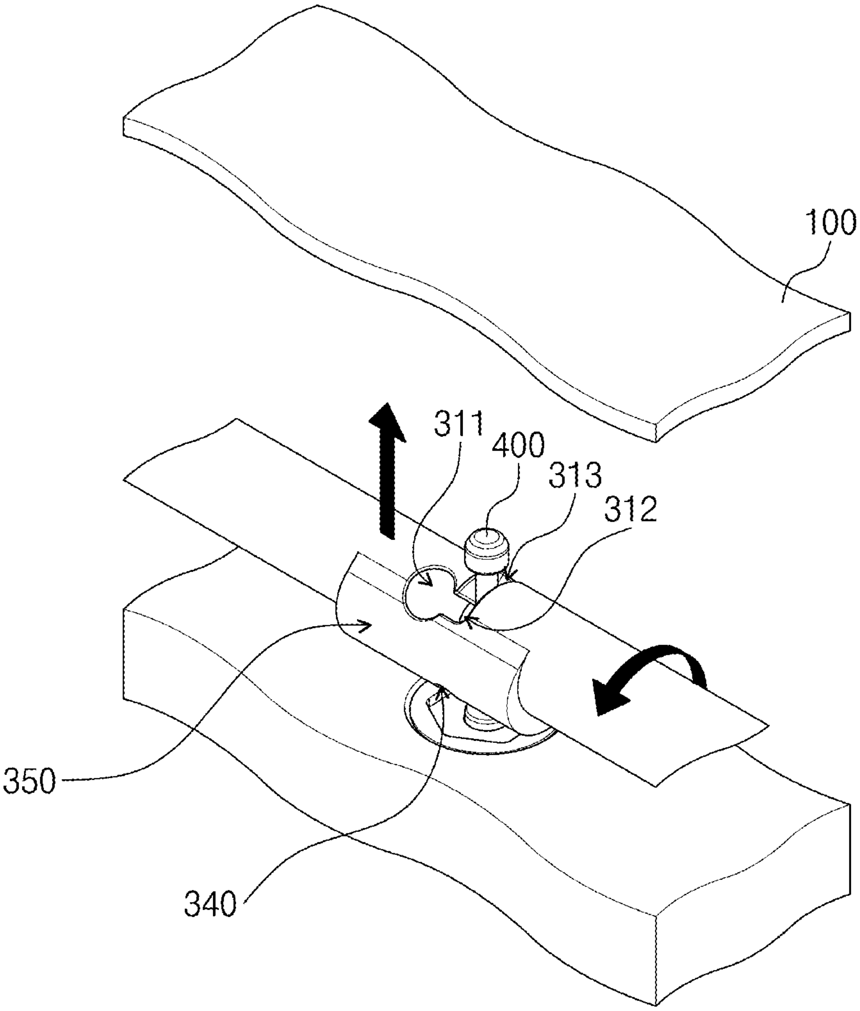
Figure 10E:
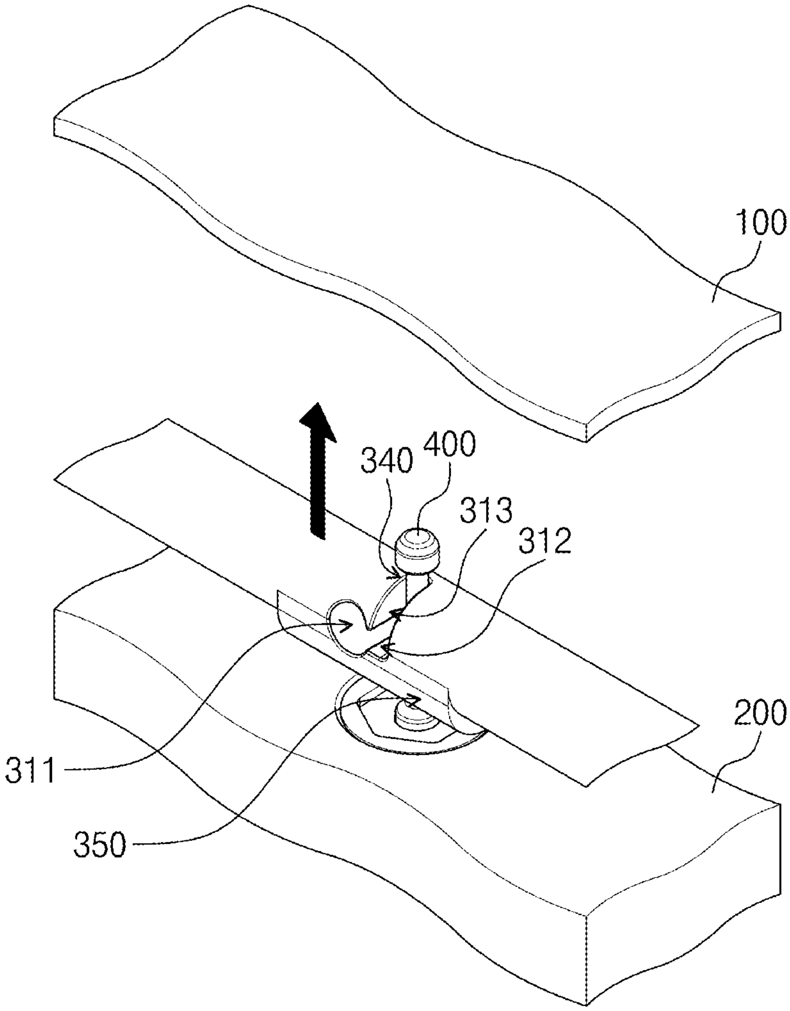
Figure 10F:
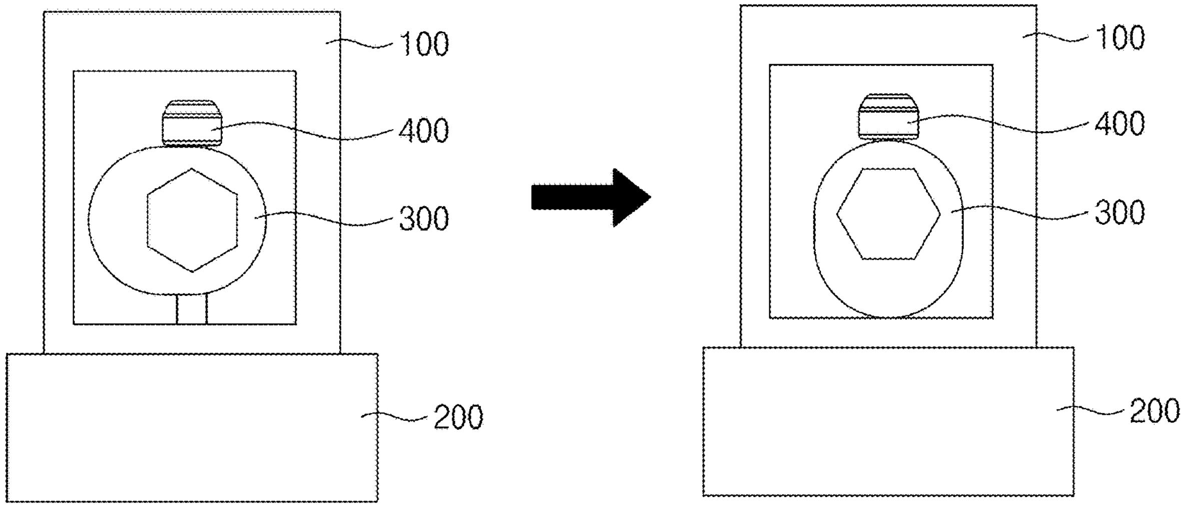
FIG. 10F illustrates front views showing a fastening process according to embodiments of the present disclosure.

Referring to FIG. 10B, in a state where the bush assembly 400 is inserted into the bush insertion groove 311 of the lift bar 300, the lift bar 300 may be moved in the axial direction through manipulation of the operation portion 320. The first path 312, formed in the coupling portion 310 of the lift bar 300, may be configured as an open structure that allows the bush 410 to pass through, and may serve to guide the axial movement of the lift bar 300.

Referring to FIGS. 10C to 10F, when the lift bar 300 is moved in the axial direction such that the bush 410 is positioned at the end of the first path 312, the lift bar 300 may be rotated through manipulation of the operation portion 320. As the lift bar 300 rotates, the bush 410 may pass through the second path 313. The second path 313 may guide the bush 410 to be positioned at the bush fixing portion 340. Also, the second path 313 may guide the bush head 411 to be positioned above the bush fixing portion 340.

As the lift bar 300 rotates, the lift portion 350, which protrudes from the coupling portion 310, comes into contact with the lower surface of the electrode support plate 100, thereby lifting the lift bar 300 from the lower surface of the electrode support plate 100. The lift bar 300 may be lifted by a height corresponding to the difference between the diameter L2 of the coupling portion 310, which includes lift portion 350, and the diameter L1 of the body portion 330. As the lift bar 300 is lifted upward, the bush 410 may be positioned at the bush fixing portion 340. Upon completion of the rotational operation, the bush fixing portion 340 may be positioned beneath the bush head 411 and support the bush head 411, whereby the plasma electrode plate 200 can be brought into close contact with and fastened to the lower surface of the electrode support plate 100.

Through the above-described components, the upper assembly according to the present disclosure may improve workability in assembling and disassembling the plasma electrode plate and the electrode support plate. In addition, it is possible to secure a uniform fastening force and maintain close contact and flatness of the plasma electrode plate. That is, by enhancing the convenience of replacing the plasma electrode plate in the upper electrode assembly and improving the structural stability of the upper electrode assembly, product quality and cost-efficiency can be secured.

According to an embodiment of the present invention, the upper electrode assembly includes a lift bar having a lift-up function capable of axial movement followed by rotation, thereby enabling the plasma electrode plate to be assembled to or disassembled from the electrode support plate quickly and reliably without the use of separate tools.

By fastening the plasma electrode plate to the electrode support plate using the lift bar, uniform fastening force can be secured, and the close contact and flatness of the plasma electrode plate can be maintained.

According to embodiments of the present disclosure, the upper electrode assembly allows the bush assembly and the lift bar to be fastened along their respective insertion grooves and paths, thereby minimizing assembly errors of the equipment.

In addition, the fixing structure between the bush assembly and the lift bar can enhance mechanical stability by preventing movement of the lift bar after fastening. When the lift bar guide unit is included, it is possible to guide the insertion direction and alignment position of the lift bar with greater precision.

While the present disclosure has been described with reference to preferred embodiments, it should be understood that these embodiments are provided for illustrative purposes only and do not limit the scope of the present disclosure. Various modifications and equivalent arrangements may be made without departing from the spirit and scope of the appended claims. Accordingly, the described embodiments should be regarded as examples rather than limitations of the present disclosure.

EXPLANATION OF SIGNS

10: Upper electrode assembly
100: Electrode support plate
110: Opening
120: Through groove
130: Receiving space
140: Rib insertion groove
200: Plasma electrode plate
210: insertion hole
300: Lift bar
310: coupling portion
311: Bush insertion groove
312: First path
313: Second path
320: Operation portion
330: Body portion
340: Bush fixing portion
350: Lift portion
400: Bush assembly
410: Bush
411: Bush head
412: Bush body
413: Fastening portion
414: Support piece
415: Protrusion
420: Washer
430: Bush fastening member
500: Lift bar guide unit

510: Lift bar guide
520: Bush head insertion portion
530: Bush head fixing portion
540: Rib
L1: Diameter of the body portion
L2: Diameter of the coupling portion

What is claimed is:

1. An upper electrode assembly comprising:
a bush assembly fastened to an insertion hole of a plasma electrode plate; and
a lift bar accommodated in a receiving space of an electrode support plate and configured to detachably couple the plasma electrode plate to the electrode support plate,
wherein the bush assembly comprises a bush configured to couple with the lift bar,
wherein the lift bar comprises a coupling portion for engaging the bush, and
wherein the coupling portion comprises:
a bush insertion groove into which the bush is inserted;
a first path configured to allow the lift bar to move in an axial direction with the bush inserted; and
a second path configured to allow the lift bar to rotate with the bush positioned at an end of the first path.

2. The upper electrode assembly as claimed in claim 1, wherein the bush assembly further comprises:
a bush fastening member for fastening the bush to the insertion hole of the plasma electrode plate; and
a washer interposed between the bush fastening member and the bush,
wherein the bush comprises:
a fastening portion disposed in the insertion hole of the plasma electrode plate; and
a bush body protruding from the fastening portion and configured to penetrate the lift bar; and
a bush head formed at an upper part of the bush body and configured to be fixed with the lift bar.

3. The upper electrode assembly as claimed in claim 2, wherein the bush further comprises a protrusion formed to protrude from the bush body,
wherein the fastening portion comprises a support piece formed at a lowermost end thereof, and
wherein the protrusion has a diameter greater than that of the bush head and smaller than that of the support piece.

4. The upper electrode assembly as claimed in claim 2, wherein the electrode support plate comprises:
an opening formed at a side of the electrode support plate, into which the lift bar is inserted; and
a through-groove formed at a lower portion of the electrode support plate, into which the bush body and the bush head are inserted.

5. The upper electrode assembly as claimed in claim 1, wherein the lift bar further comprises:
an operation portion configured to manipulate axial movement and rotation of the lift bar; and
a body portion in a form of a bar extending in the axial direction.

6. The upper electrode assembly as claimed in claim 5, wherein the operation portion is disposed at an end of the lift bar adjacent to the opening,
wherein the coupling portion comprises a plurality of coupling portions, and
wherein the body portion is disposed between the plurality of coupling portions.

7. The upper electrode assembly as claimed in claim 5, wherein the lift bar further comprises a lift portion formed in either the coupling portion or the body portion, and
wherein the lift portion is configured to lift the lift bar from beneath the electrode support plate upon rotation of the lift bar.

8. The upper electrode assembly as claimed in claim 2, wherein the lift bar further comprises a bush fixing portion configured to fix the bush head and the lift bar in a state in which the lift bar is rotated, and
wherein the bush fixing portion is disposed below the bush head to support the bush head.

9. The upper electrode assembly as claimed in claim 1, further comprising:
a lift bar guide unit disposed in the receiving space of the electrode support plate,
wherein the lift bar guide unit comprises a lift bar guide configured to receive the lift bar.

10. The upper electrode assembly as claimed in claim 9, wherein the lift bar guide unit further comprises:
a bush head insertion portion configured to receive the bush head of the bush; and
a bush head fixing portion configured to fix the bush head.

11. The upper electrode assembly as claimed in claim 10, wherein the lift bar guide further comprises a rib protruding from a side thereof, and
wherein the receiving space of the electrode support plate comprises a rib insertion groove into which the rib is inserted.

* * * * *